United States Patent [19]

Sheu et al.

[11] Patent Number: 5,764,858
[45] Date of Patent: Jun. 9, 1998

[54] ONE-DIMENSIONAL SIGNAL PROCESSOR WITH OPTIMIZED SOLUTION CAPABILITY

[75] Inventors: Bing J. Sheu, Los Angeles; Sa H. Bang, Santa Clara; Theodore W. Berger, Rancho Palos Verdes, all of Calif.

[73] Assignee: University of Southern California, Los Angeles, Calif.

[21] Appl. No.: 527,933

[22] Filed: Sep. 14, 1995

[51] Int. Cl.$^6$ .................................. G06E 1/00; G06E 3/00
[52] U.S. Cl. ........................ 395/22; 395/21; 395/24
[58] Field of Search .......................... 395/20–25, 27, 395/2.4, 2.44, 155–161; 382/155–159; 704/231, 235

[56] References Cited

U.S. PATENT DOCUMENTS

| | | | |
|---|---|---|---|
| 4,885,757 | 12/1989 | Provence | 375/96 |
| 5,140,670 | 8/1992 | Chua et al. | 395/24 |
| 5,261,035 | 11/1993 | Adler | 395/24 |
| 5,319,677 | 6/1994 | Kim | 375/100 |
| 5,355,528 | 10/1994 | Roska et al. | 395/24 |
| 5,377,302 | 12/1994 | Tsiang | 395/2.44 |
| 5,649,061 | 7/1997 | Smyth | 395/20 |
| 5,649,065 | 7/1997 | Lo et al. | 395/23 |

FOREIGN PATENT DOCUMENTS

| | | | |
|---|---|---|---|
| 94/306842 | 9/1994 | European Pat. Off. | H03M 13/12 |
| PCTUS9409731 | 8/1994 | WIPO | G06F 15/00 |

OTHER PUBLICATIONS

Sheu et al, "Optimal solutions of selected cellular neural network applications by the hardware annealing method," 1994 IEEE Workshop on cellular neural networks and their applications, pp. 279–284, Dec. 1994.

Ulug, "A signal processing neural network resembling the simple cells of the visual cortex," 1992 RNNS/IEEE Symposium on neuroinformatics and neurocomputers, pp. 978–989, Oct. 1992.

Knecht et al, "Neural network filters for speech enhancement," Transactions on speech and audio processing, vol. 3, No. 6, pp. 433–438, Nov. 1995.

*Primary Examiner*—Tariq R. Hafiz
*Attorney, Agent, or Firm*—Oppenheimer Wolff & Donnelly LLP

[57] ABSTRACT

An architecture and design of compact neural networks is presented for the maximum-likelihood sequence estimation (MLSE) of one-dimensional signals, such as sound, in digital communications. Optimization of a concave Lyapunov function associated with a compact neural network performs a combinatorial minimization of the detection cost, and truly paralleled operations in the analog domain are achievable via the collective computational behaviors. In addition, the MLSE performance can be improved by paralleled hardware annealing, a technique for obtaining optimal or near-optimal solutions in high-speed, real-time applications. For a sequence of length n, the network of complexity and throughput rate are O(L) and $n/T_c$, respectively, where L is the number of symbols the inference spans and $T_c$ is the convergence time. The hardware architecture as well as network models, neuron models, and methods of feeding the input to the network are addressed in terms of the probability of error.

57 Claims, 7 Drawing Sheets

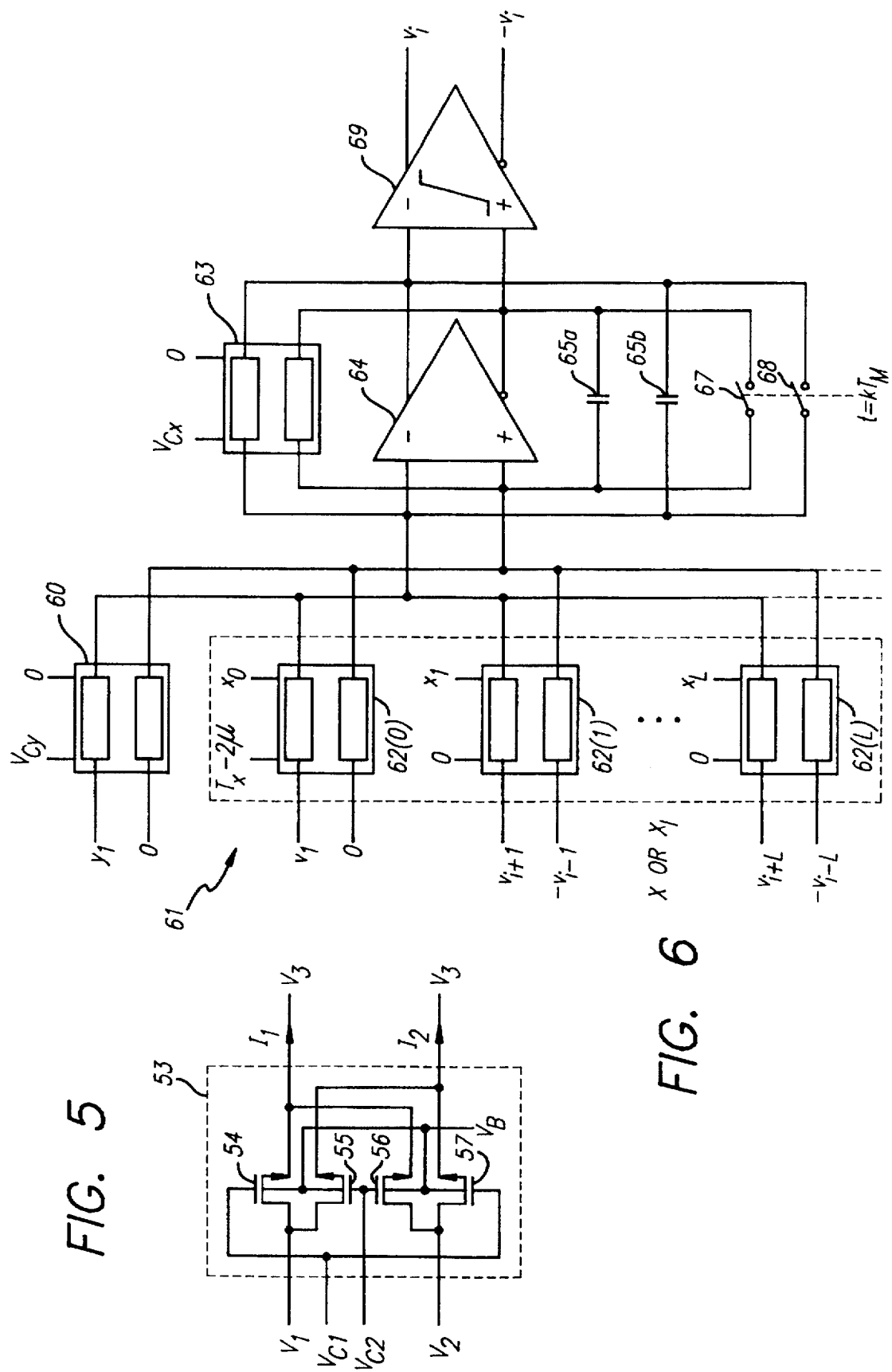

ONE-DIMENSIONAL SIGNAL PROCESSOR WITH OPTIMIZED SOLUTION CAPABILITY

This invention was made with Government support under Grant Nos. N00014-92-J-4111 and N00014-94-1-0568, awarded by the Office of Naval Research. The Government has certain rights in this invention.

FIELD OF THE INVENTION

The present invention relates to adaptive digital transmission receivers, and more specifically to methods and apparatus for integrating maximum-likelihood sequence estimation and compact neural networks into signal processors for efficiently processing single dimensional signals.

BACKGROUND OF THE INVENTION

Single-dimensional signals, such as speech signals, are typically reconstructed by a receiver of such signals utilizing digital signal processing techniques. These techniques provide solutions to problems inherent in complex signal reconstruction. Various digital domain signal processing solutions currently exist, and one of the more common techniques involves the maximum likelihood sequence estimation technique, or MLSE. MLSE is an optimum method of detecting digital data symbols transmitted over time-dispersive, time-varying channels in the presence of additive white Gaussian noise. As a class of nonlinear receivers, the MLSE detectors exhibit an optimum error rate performance compared to its linear counterparts. However, an MLSE receiver is often impractical to construct due to the computation-intensive complexity required for the signal processing functions. A more efficient computational method of implementing MLSE is the Viterbi algorithm in which redundant computations involved in the MLSE are avoided.

From an optimization point of view, the MLSE is a combinatorial maximization or minimization of the cost function over all possible sequences of a certain length.

The signaling alphabet $\alpha=\{\alpha_k\}$, k=1, 2, ..., M, and sequence $s_n=\{s_i\}$, i=0, 1, ... n-1, correspond to a finite set of numbers and the degree of freedom, respectively. MLSE computes the cost function over $M^n$ possible combinations. From an optimization standpoint, the problem with the MLSE is the inability to quickly and efficiently find a global minimum for a given optimization problem.

The Viterbi algorithm is a dynamic programming algorithm which solves the problem of maximum a posteriori probability estimation of the state of a finite-state, discrete-type Markov process observed in the presence of memoryless noise. The Viterbi algorithm determines the optimal path through a trellis structure defining all possible state transitions, and the algorithm significantly reduces the number of computations required to implement the MLSE.

The Viterbi algorithm involves an iterative summation of product terms. Since the entire computational sequence is calculated for every digital bit transmitted, the time required for each computation usually limits the system transmission rate. Increasing computational speed tends to only slightly increase the data transmission rate.

However, wireless digital communication systems, including systems which utilize MLSE or Viterbi processing, are largely affected by their inability to overcome channel impairment. Channel impairment affecting wireless digital communications systems include the negative effects of noise, limited system bandwidth, and multipath propagation through surrounding objects.

Other attempts to reduce the computational costs associated with the Viterbi algorithm include reducing the transmission channel memory and reducing the number of states in the MLSE trellis structure. Transmission channel memory reduction increases the channel noise and decreases the signal-to-noise ratio of the received signal, while state reduction increases the receiver error rate.

Artificial neural networks have been shown to be highly effective in solving many complex signal processing and optimization problems that cannot be addressed satisfactorily with conventional digital system approaches. The supervised or unsupervised learning methods and massively parallel architectures of artificial neural networks provide attractive properties of optimization and fast problem solving. Use of neural network approaches in communications have been motivated by the adaptive learning capability and the collective computational properties to process real-world signals, as well as a response to signal processing methods which are inherently serial.

Compact neural networks are large scale networks of regularly spaced cells, wherein each cell is connected only to neighboring cells. Neighboring cells only interact with each other, and cells not interconnected may affect one another indirectly as a result of propagation of signals throughout the network. Well designed neural networks have the ability to perform the error correction of error-control codes, equalization of transmission channels, crossbar switch control, and wireless/networking control.

Several communications applications for neural networks currently exist, but none efficiently solve the intersymbol interference problem associated with a one-dimensional signal by searching a globally minimum energy state in a relatively short period of time without multiple layers of system complexity. For example, U.S. Pat. No. 4,885,757 to Provence presents a Hopfield network which is fully connected, i.e. a neural network wherein each and every element in the network connect to each and every other element. Such a system adds a nonlinear level of complexity, such that scaling the system upward, or increasing system size from an n-unit system, provides a system having a level of complexity of $n^2$. Chua et al., U.S. Pat. No. 5,140,670, provides solutions for two-dimensional image processing, a completely different problem from the one-dimensional problem which do not provide the optimal or near-optimal solutions for high-speed, real-time applications due to the unnecessary complexity of the image processing architecture. Chua neither discusses nor discloses communications or other single-dimensional signal applications. Roska et al., U.S. Pat. No. 5,355,528, is a computer version of the architecture contained in the Chua patent which discloses how to build a supercomputer embodying the teachings of the Chua patent. Jones, PCT/US94/09731 discloses a bionic eye and again addresses two dimensional image processing and image recognition. The methods and systems presented in these patents do not efficiently resolve single-channel signal cost function solutions.

It is therefore an object of this invention to provide a system which efficiently solves the intersymbol interference problem associated with a one-dimensional signal by searching a globally minimum energy state in a relatively short period of time without having multiple layers of system complexity.

It is another object of the current invention to provide a system for minimizing the computation complexity required for the signal processing functions.

It is yet another object of the current invention to provide a system to quickly and efficiently find a global minimum for a given single-dimension signal optimization problem.

3

It is still another object of the current invention to provide a receiver which minimizes the effects of noise, limited system bandwidth, and multi-path propagation through surrounding objects.

It is still another object of the current invention to decrease channel noise and receiver error rate and maximize the signal-to-noise ratio of the received signal.

SUMMARY OF THE INVENTION

According to the present invention, there is herein provided a nonlinear neural network as a paralleled computational framework of the MLSE. The network has collective computational properties similar to those of Hopfield neural networks and can be used to solve difficult optimization problems especially for image processing applications. The cost function to be minimized in the MLSE takes the quadratic form of the Lyapunov function. The cost function is mapped onto the network thereby providing the desired estimate at the output. However, for a combinational optimization, such system mapping suffers from the local minimum problem as in Hopfield neural networks. Optimum or near optimum solutions are obtained by the disclosed invention by applying the paralleled hardware annealing which is a deterministic relaxation process for searching a globally minimum energy state in a short period of time. As an efficient implementation of MLSE function, a hardware-annealed network provides a real-time machine for combinatorial optimization.

The compact neural network receiver provides an optimal solution for a received one-dimensional signal, and comprises a signal dividing circuit which separates the received one-dimensional signal into an in-phase signal and a quadrature-phased signal. The system includes a plurality of samplers, where the samplers sample the inphase signal and quadrature-phased signal at a predetermined rate, producing an in-phase discrete time signal and a quadrature-phased discrete time signal. The system also includes a channel estimation filter which receives output from the samplers and transmits L channel estimates. The channel estimator is matched to a channel impulse response. The system further comprises a correlation filter which correlates the discrete time signals with the channel impulse response and transmits an in-phase output and a quadrature-phase output. The correlation filter transmits the in-phase output and the quadrature-phase output through delay lines, and to a compact neural network having shift-invariant piecewiselinear function neurons receiving the in-phase delayed output, the quadrature-phase delayed output, and the channel estimates. The compact neural network comprises multiple identical analog cells arranged in an array. The cells in the array are interconnected with all neighboring cells. The system maps an MLSE cost function onto the neural network using a cost function, an energy function, a system transconductance matrix and information received from the delay lines. The energy function is calculated using normalized predetermined coefficient templates as well as delay line information.

The system further includes a system of hardware annealing, which comprises means for providing independent control over all cells in the compact neural network and a nonlinear gain circuit in each cell. The nonlinear gain element sets neuron gain to a relatively small positive value, increases neuron gain continuously during an initial time period to a value of unity, and maintains the neuron gain at unity for a subsequent time period.

Other objects, features, and advantages of the present invention will become more apparent from a consideration of the following detailed description and from the accompanying drawings.

DESCRIPTION OF THE DRAWINGS

FIG. 5 is a schematic diagram of a double-MOS linear resistor as used in a proposed hardware implementation of the present invention.

FIG. 6 presents the proposed hardware implementation of the i-th neuron and associated synapses.

DESCRIPTION OF THE PREFERRED EMBODIMENT

Performing maximum likelihood decoding of linear block error-correcting codes is equivalent to finding a global minimum of the energy function associated with a neural network. Given a code, a neural network can be constructed in such a way that there exists one-to-one correspondence between every codeword and every local minimum of the energy function. Decoding techniques using neural networks can solve problems of maximization of polynomials over the multi-dimensional space.

Compact neural networks are analog systems which interact asynchronously and do not depend on a reference clock. Construction of compact neural networks may be more beneficial for particular systems to optimize cost and weight constraints.

Digital Communication and Neural Networks

Figure 1:
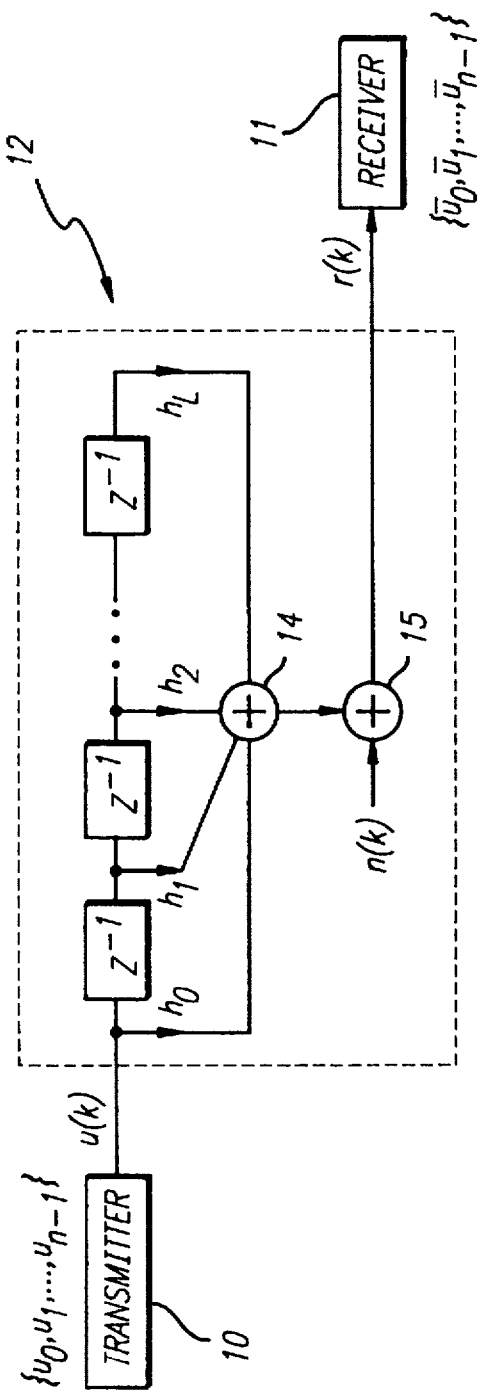
FIG. 1 shows a block diagram of the baseband model of a digital communication system.

FIG. 1 shows the block diagram of the baseband model of a digital communication system over the inter-symbol interference (ISI) and additive Gaussian noise channel. Transmitter 10 initially transmits a vector of signals $\{u_0, u_1, \ldots u_{n-1}\}$ to the discrete time channel model 12. The actual ISI channel together with baseband Nyquist filters in the transmitter 10 and receiver 11 can be modeled as a finite impulse response (FIR) filter 12 of length L+1. The signal is split into L+1 discrete channel estimates $h_0$ through $h_L$ using inverse z-transform blocks 13(0) through 13(L). The channel estimates are added at channel estimate summation element 14, and gaussian white noise n(k) is added to the system at noise summation element 15. The impulse response of the FIR filter 12 is thus given by $h(k)=h_k$ and has the corresponding z-transform H(z). Here, L is the number of symbol intervals over which the ISI spans and hence h(k)=0 for k<0 and k>L. The received signal r(t) is produced by the convolution of u(k)=$\Sigma_i u_i \delta(k-i)$ with h(k) where $\delta(k)$ is the Kronecker delta function, plus white Gaussian noise n(k) of zero-mean and finite variance $\sigma^2$.

$$r(k) = \sum_{i=0}^{L} u_{k-i}h_i + n(k). \quad (1)$$

The maximum-likelihood sequence estimator selects a sequence as a best estimate of the transmitted sequence. The sequence maximizes the conditional a posterior probabilities $p(r_n|u_n)$, where $r_n=\{r_0,r_1,\ldots,r_{n-1}\}$ and $u_n=\{u_0,u_1,\ldots,u_{n-1}\}$ are the received and transmitted sequences of length n, respectively. For a sufficiently large n, the MLSE algorithm must choose a sequence that maximizes the scalar cost function:

$$J = -\sum_{k=0}^{n-1}\left| r_k - \sum_{i=0}^{L} h_i u_{k-i}\right|^2 = -\sum_{k=0}^{n-1}\left| r_k - \sum_{i=0}^{n-1} h_{k-i} u_i \right|^2 \quad (2)$$

for all possible combinations of sequences of length n.

With the minus sign, the cost function of Equation 2 is simply the sum of squared-errors between received samples and the outputs of a noise-free channel for the input $u_n$. The evaluation of values given by Equation 2 must be performed over all possible sequences of $u_n=\{u_0, u_1, \ldots, u_{n-1}\}$. Therefore, the algorithm complexity is proportional to $M^n$, where M is the number of signaling alphabets, i.e., $u_k \in \{\alpha_1, \alpha_2, \ldots, \alpha_M\}$, $\forall k$ and n is the length of the sequence to be estimated.

In typical data communication in which the length of a sequence is not given explicitly, the number n can be arbitrarily large and in principle could be infinity. Expanding Equation 2, the first term may be discarded because it is a constant for the given input $r_n$. Then, by changing the sign of the resulting cost function and dividing it by 2, the MLSE is equivalent to minimizing the quantity:

$$\hat{J}_n = -Re\left\{\sum_{i=0}^{n-1}\left[\sum_{k=0}^{n-1} r_k h_{k-i}^*\right] u_i^*\right\} + \quad (3)$$

$$\frac{1}{2} \sum_{i=0}^{n-1}\sum_{j=0}^{n-1}\left[\sum_{k=0}^{n-1} h_{k-i} h_{k-j}^*\right] u_i u_j^*$$

$$= \frac{1}{2}\sum_{i=0}^{n-1}\sum_{j=0}^{n-1} x_{j-i} u_i u_j^* - Re\left\{\sum_{i=0}^{n-1} y_i u_i^*\right\},$$

where $$y_i \equiv \sum_{k=0}^{n-1} r_k h_{k-i}^*$$

$$x_i \equiv \sum_{k=0}^{n-1} h_k^* h_{k-i} = \sum_{k=0}^{L} h_k^* h_{k+i}.$$

The sample $y_i$ is the cross-correlation between the received signal and h(k), while $x_1$ is the auto-correlation of h(k). Here, the channel is assumed to be time-invariant during at least n symbol intervals so that $x_{-k}=x_k^*$, $k=1,2,\ldots,L$. In vector and matrix forms, Equation 3 can be written as $$\hat{J}_n = \frac{1}{2} u^H X u - Re\{u^H y\} \quad (4)$$

where $$u = [u_0 u_1 \ldots u_{n-1}]^T = u_I + ju_Q, \quad u \in \{\alpha_1, \alpha_2, \ldots, \alpha_M\}^n, \alpha_i \in C$$

$$y = [y_0 y_1 \ldots y_{n-1}]^T = y_I + jy_Q, \quad y \in C^n$$

$$X = \begin{bmatrix} x_0 & x_{-1} & \ldots & x_{-n+2} & x_{-n+1} \\ x_1 & x_0 & \ldots & x_{-n+3} & x_{-n+2} \\ \vdots & & & & \vdots \\ x_{n-2} & x_{n-3} & \ldots & x_0 & x_{-1} \\ x_{n-1} & x_{n-2} & \ldots & x_1 & x_0 \end{bmatrix} = X_I + jX_Q, \quad X \in C^{n \times n}.$$

In general, a data communication system transmits and receives a sequence of complex-valued data symbols $\{u_k\}$, where $u_k=u_{I,k}+ju_{Q,k}$, $u_{I,k} \in \alpha_I$, $u_{Q,k} \in \alpha_Q$. In this case, the correlation matrix X is Hermitian and positive semi-definite, which implies that $X_I^T=X_I$ is symmetric and $X_Q^T=-X_Q$ is skew symmetric from the equality $X^H=X_I^T-jX_Q^T=X=X_I+jX_Q$, and all eigenvalues of X are real and non-negative. In almost any situation except the case $x_0=0$, X is positive definite. The cost function $\hat{J}_n$ given by Equation 3 is a real number which must be represented by real qualities in the right-hand side for a physical realization of the equation. By using the properties of symmetric and skew-symmetric matrices, Equation 4 can be expanded and reformulated as $$\hat{J}_n = \frac{1}{2} (u_I^T X_I u_I + 2 u_Q^T X_Q u_I + u_Q^T X_I u_Q) - \quad (5)$$

$$(u_I^T y_I + u_Q^T y_Q)$$

$$= \frac{1}{2} [u_I^T u_Q^T]\begin{bmatrix} X_I & X_Q^T \\ X_Q & X_I \end{bmatrix}\begin{bmatrix} u_I \\ u_Q \end{bmatrix} -$$

$$[u_I^T u_Q^T]\begin{bmatrix} y_I \\ y_Q \end{bmatrix}$$

$$\equiv \frac{1}{2} \tilde{u}^T \tilde{X} \tilde{u} - \tilde{u}^T \tilde{y}.$$

Let $x^T=[x_1^T|x_2^T]$ where $x_1, x_2 \in R^n$. Then $$x^T \tilde{X} x = \begin{bmatrix} x_1 \\ x_2 \end{bmatrix}^T \begin{bmatrix} X_I & X_Q^T \\ X_Q & X_I \end{bmatrix}\begin{bmatrix} x_1 \\ x_2 \end{bmatrix} = \quad (6)$$

$$x_1^T X_I x_1 + x_1^T X_Q^T x_2 + x_2^T X_Q x_1 + x_2^T X_I x_2.$$

Since X is Hermitian and positive semi-definite the quantity $\tilde{x}^H X \tilde{x}$ is real and non-negative for any $\tilde{x} \in C^{2n}$. Using $\tilde{x}=x_1+jx_2$, we have $$\tilde{x}^H X \tilde{x} = (x_1+jx_2)^H (X_I+jX_Q)(x_1+jx_2) \quad (7)$$

$$= x_1^T X_I x_1 - x_1^T X_Q x_2 + x_2^T X_Q x_1 + x_2^T X_I x_2 \geq 0.$$

From the skew-symmetric property of $x_Q$, it can be shown that Equations 6 and 7 are the same. Therefore, the matrix X is symmetric and positive semi-definite i.e., $x^T \tilde{X} x \geq 0$ $\forall x \in R^{2n}$. The symmetry property of $\tilde{X}$ is sufficient condition for guaranteed stable operation of the neural network as described subsequently.

Figure 2B:
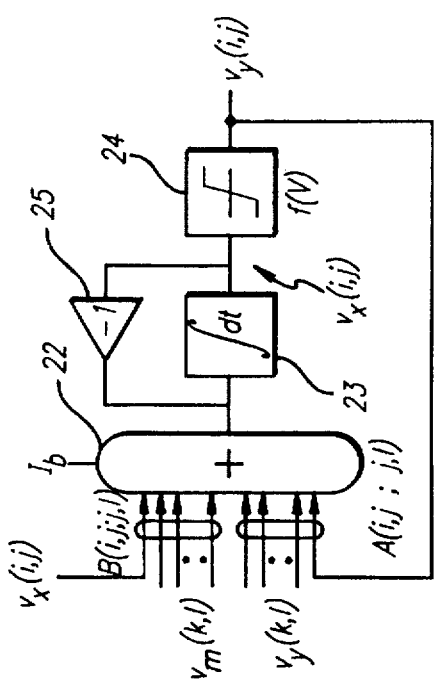
FIG. 2b is a functional block diagram of a neuron cell.
Figure 2A:
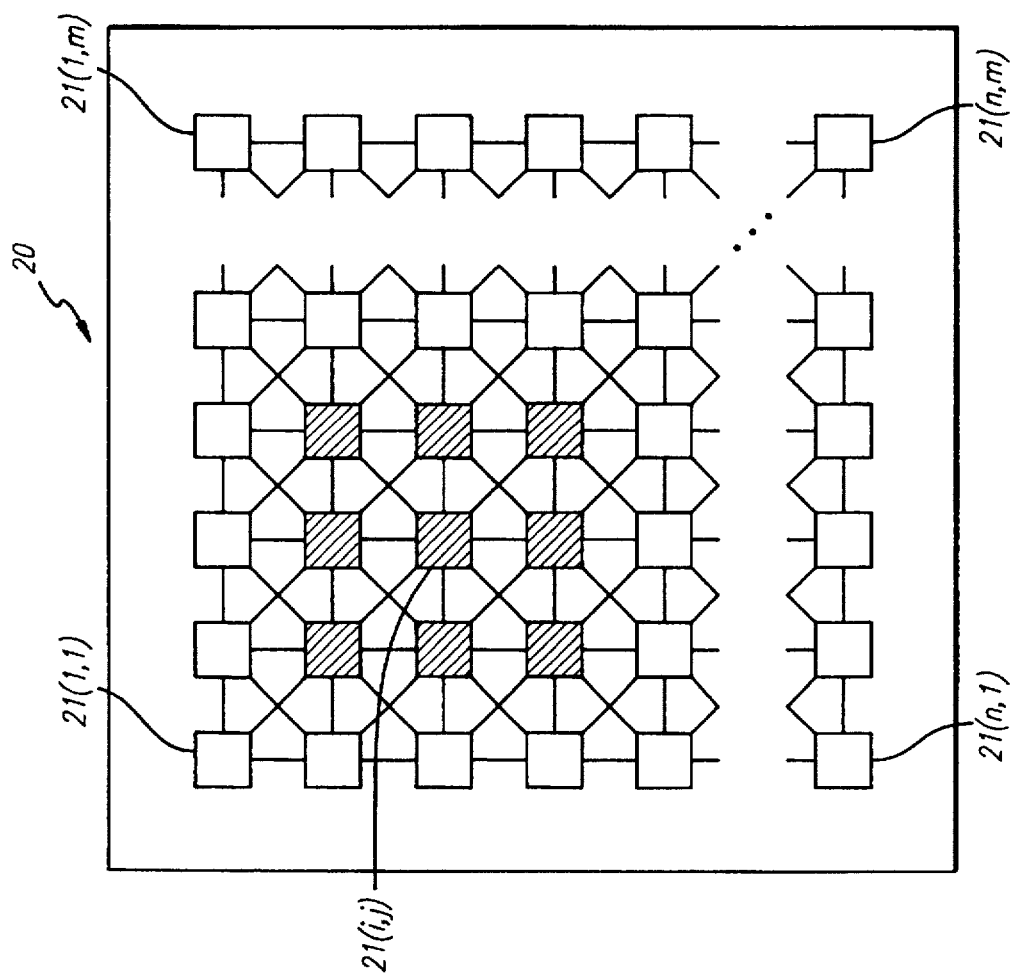
FIG. 2a illustrates an n by m cellular network on a rectangular grid.

A cellular neural network (CNN) is a continuous- or discrete-time artificial neural network which features a multi-dimensional array of neuron cells and local interconnections among the cells. The basic CNN proposed by Chua and Yang is a continuous-time network in the for an N-by-M rectangular-grid array where N and M are the numbers of rows and columns, respectively. Each cell in a CNN corresponds to an element of the array. FIG. 2a shows the block diagram of a typical CNN, and FIG. 2b is the circuit diagram of a neuron cell. Cellular neural network 20 is a two dimensional array which includes cells 21(1,1) through 21(n,m), with interconnections between neighboring cells. For example, cell 21(1,1) interacts with its three neighboring cells 21(1,2), 21(2,1), and 21(2,2). Cells not on an edge of the array, such as cell 21(i,j) shaded in FIG. 2a, interact with the eight adjacent or neighboring cells. With $N_r(i,j)$ being the r-th neighborhood cells of cell $C(i,j)$, the dynamics of a CNN can be described by a set of nonlinear differential equations:

$$C\frac{dv_{xij}(t)}{dt} = -\frac{1}{R_x} v_{xij}(t) + \sum_{C(k,l) \in N_r(i,j)} A(i,j; k, l)v_{ykl}(t) + \quad (8)$$

$$\sum_{C(k,l) \in N_r(i,j)} B(i,j; k, l)v_{ukl}(t) + I_b; \ 1 \leq i \leq N, 1 \leq j \leq M,$$

where $v_{xij}(t)$, $v_{yij}(t)$, and $v_{uij}(t)$ are the state, output, and input voltage of the cell. $C(i,j)$. $A(i,j;k,l)$ and $B(i,j;k,l)$ are feedback and feedforward synaptic weights, respectively, between cells $C(i,j)$ and $C(k,l) \in N_r(i,j)$. C and $R_x$ are the equivalent capacitance and resistance at the state node, and $I_b$ is the bias current to the cell. The magnitude of neuron output voltage is often normalized to unity so that $-1 \leq v_{yk} \leq 1, \forall k$.

FIG. 2b illustrates the performance of an individual cell in the array of the cellular neural network 20. The cell summation element 22 receives feedforward and feedback data $v_u(i,j)$ and $v_y(i,j)$ multiplied by the A and B matrices determined by the coefficient templates, discussed below. The summed values received by cell summation element 22 are then integrated by integration element 23 to form state element $v_x(i,j)$, which is then passed through non-linear amplifier 24. Inverter 25 performs feedback to nonlinear amplifier 24. Data is then fed back from the output of non-linear amplifier 24 to cell summation element 22.

The cell imposes a nonlinearity between the state variable and the output result and its transfer function can be represented by $v_{yij}(t)=f(v_{xij}(t))$. The nonlinear function used in a network is the piecewise-linear function:

$$y = f(x) = \frac{1}{2} \ (|x+1| - |x-1|) \quad (9)$$

The shift-invariant networks have interconnections which do not depend on the position of cells in the array except at the edges of the array. The shift-invariant property of the network is the most desirable feature when implementing a large-size electronic network on a VLSI chip.

The operation of a shift-invariant network can be represented by the (2r+1)×(2r+1) feedforward and feedback coefficient templates:

$$T_A = \{a_{p,q}, -r \leq p, q \leq r\}, \quad (10)$$

$$T_B = \{b_{p,q}, -r \leq p, q \leq r\}.$$

For the network with the piecewise-linear function, the Lyapunov or generalized energy function is given by:

$$E(t) = -\frac{1}{2} \sum_{i,j} \sum_{C(k,l) \in N_r(i,j)} A(i,j; k, l)v_{yij}(t)v_{ykl}(t) + \quad (11)$$

$$\frac{1}{2R_x} \sum_{i,j} (v_{yij}(t))^2 - \sum_{i,j} \sum_{C(k,l) \in N_r(i,j)} B(i,j; k, l)v_{yij}(t)v_{ukl} - \sum_{i,j} I_b v_{yij}(t).$$

Let n be the number of cells in a network. In vector and matrix forms Equation 11 is a scalar-valued quadratic function of the output vector y, $$E = -\frac{1}{2} v_y^T A v_y + \frac{1}{2R_x} v_y^T v_y - v_y^T B v_u - I_b v_y^T w \quad (12)$$

$$= -\frac{1}{2} v_y^T M v_y - v_y^T b,$$

where $M=A-(1/R_x)I$ and $b=Bv_u+I_b w$ for an n-by-1 unity vector w.

In Equation 12, A and B are two real matrices determined by the given coefficient templates $T_A$ and $T_B$, respectively, the elements of which are often normalized to the scale of $T_x$, e.g., $10^{-3}$. For shift-invariant symmetric coefficient templates and some other classes, matrices A and M are symmetric. The dynamics of the output $v_y$ is confined within an n-dimensional unit hypercube defined as $D^n = \{v_y \in R^n : -1 \leq v_{y_i} \leq 1; k=1,2,\ldots,n\}$. Under the constraint conditions $|v_{xij}(0)| \leq 1$ and $|v_{uij}| \leq 1, \forall i,j$, the shift-invariant network with a symmetric A always produces a stable output in the steady state. Moreover, if $A(i,j;i,j) > 1/R_x$, then the saturated binary outputs, i.e., vertices of the hypercube $D^n$, are guaranteed to be in the steady state.

THE SYSTEM ARCHITECTURE

The signaling alphabet $\alpha = \{\alpha_1, \alpha_2, \ldots, \alpha_M\}$ depends on the modulation techniques employed. For the purposes of illustration, the binary and QPSK modulations are considered herein. In this case, the binary antipodal neurons of the form in Equation 9 may be directly incorporated with the signaling formats. However, a neural network with multilevel neurons can be used for more complicated signal constellations, e.g., 4-level bipolar neurons for 16-ary QAM.

FIG. 3 shows the block diagram of the compact neural network MLSE receiver. The received signal r(t) is first separated into two baseband signals, i.e., in-phase signal $r_I(t)$ and quadra-phase signal $r_Q(t)$ using cosine function multiplier 31 for the quadrature-phase signal and sine function multiplier 32 for the in-phase signal. The signals are then sampled at t=KT by in-phase sampler 34 and quadrature-phase sampler 33, where T is the duration of a symbol. Channel estimator 36 produces the channel impulse response and L+1 channel estimates. The discrete-time signals $r_I(k)$ and $r_Q(t)$ received from in-phase sampler 34 and quadrature-phase sampler 33 are correlated with the channel impulse response h(k) in correlation filter 35. The correlation filter 35 is matched to channel impulse response h(k) and is approximated by an FIR filter, whose tab coefficients are updated sequence by sequence.

In general, because the channel characteristics are not known, the channel impulse response is also estimated by using the received reference signals. Thus, the estimate ĥ(k) is transmitted to correlation filter 35. Channel estimation is equivalent to finding a set of filter coefficients that minimizes the cost function or the mean-squared errors between received and desired signals. Therefore, the channel estimate corresponds to a convex optimization problem that can be efficiently solved by a neural network. However, the structure of the channel estimator 35 may be of the form of channel estimators commonly known to those of ordinary skill in the communications arts.

A compact neural network can be used as the core of nonlinear signal processing for the MLSE as shown in FIG. 3. From Equations 5 and 12, the desired estimate $\hat{a}_u$ can be obtained at the output of a network if $$M = -\overline{X} = -\left[ \frac{X_I X_Q^T}{X_Q X_I} \right] \text{ and } b = \overline{y} = \left[ \frac{y_I}{y_Q} \right]. \quad (13)$$

In other words, the cost function $\hat{J}_n$ is mapped onto a compact neural network 39 constructed by the transconductance matrix $\overline{A} = -\overline{X} + T_x I$ and input vector $b = \overline{y}$. Here, the constant term $T_x I$ represents a positive unity feedback in each cell. If the compact neural network 39 produces saturated binary or multi-level values in the steady-state, the output represents the MLSE of received sequence, i.e., $\hat{a}_n = \{\hat{a}_0 \hat{a}_1 \ldots \hat{a}_{n-1}\}$. After n symbols are shifted into in-phase delay line 37 and quadrature-phase delay line 38, the compact neural network 39 performs the MLSE of an n-symbol sequence through an autonomous evolution of its internal state for $0 \leq t < T_c$ where $T_c$ is the convergence speed of the network. In-phase and quadrature-phase data is then latched to form the in-phase and quadrature-phased estimate of the signal using latches 40. If the shift operations of delay lines are pipelined, the compact neural network 39 can estimate $n/T_c$ symbols per second. For example, if $T_c = 1$ µsec and $n = 100$, then a real-time operation of symbol rate up to $1 \times 10^8$ symbols/sec is readily achievable.

The Lyapunov function of a Hopfield neural network with threshold neurons is of the form described in Equation 12 and has been utilized to solve many optimization problems. However, for the cost functions of the form described in Equation 5 in which the diagonal elements are non-zero, the neuron gain must be finite and large for guaranteed stable operation. Large finite neuron gain produces high-order nonlinear terms in the energy function which can cause errors in mapping of a cost onto the energy function. On the other hand, the expression in Equation 12 of a compact neural network with the piecewise-linear neurons is an exact quadratic function that can be easily incorporated with a large class of optimization problems.

When the MLSE cost function is mapped onto a compact neural network by Equation 13, one difficulty may arise. For the autocorrelation function, $x_0 \geq 0$ and all the diagonal elements of M are negative $A(i,j;i,j) -T_x = -x_0 \leq 0$ and the amount of positive self-feedback in each cell is less than one. In other words, the matrix $-M = \overline{X}$ is positive semi-definite and E is a convex function of output $V_y$. Correspondingly, the saturated binary output is not guaranteed and continuous-valued steady-state output $v_y \in D^{2n}$ may occur. Although it is possible to obtain the desired estimate by using additional limiting devices at the output, a network with combinatorial solutions $V_y = \overline{u} \in \{-1,+1\}^{2n}$ is highly desirable for reducing the circuit complexity and the effect of noise. To transform the convex optimization into a concave equivalence, the constraint energy $$E_C = \mu \sum_{k=1}^{n} (v_{yk}^2 - 1) = \mu(v_y + w)^T(v_y - w), \quad (14)$$

is added to the energy function, where w is a 2n-by-1 unity vector and a constant µ is chosen such that $\overline{M} = -\overline{X} - 2\mu I$ is positive definite. The constraint energy corresponds to an additional cost for constraint satisfaction in mathematical optimization and must satisfy $E_c \geq 0$, $v_y \in D^{2n}$, where the equality holds only if $v_y \in \{-1, +1\}^{2n}$. If we neglect the constant term $\mu w^T w = \mu(2n)$, the cost function of Equation 5 is mapped onto a neural network with a modified energy function.

$$\hat{E} = E|_{M=\overline{X}, b=\overline{y}} + \mu v_y^T v_y = -\frac{1}{2} v_y^T(-\overline{X} - 2\mu I)v_y - v_y^T \overline{y} \quad (15)$$

$$= -\frac{1}{2} v_y^T \overline{M} v_y - v_y^T \overline{y} = -\frac{1}{2} v_y^T (\overline{A} - T_x I) v_y - v_y^T \overline{y},$$

where I is a 2n by 2n unity matrix and $\overline{A} = -\overline{X} + (T_x - 2\mu) I$. The parameter µ controls the shape of energy landscape. If $\mu < -\lambda_{max}/2$ where $\lambda_{max}$ is the maximum eigenvalue of $\overline{X}$, then $\hat{E}$ is a concave function of $v_y$ by the negative definiteness of $-\overline{M} = \overline{X} + 2\mu I$, and the saturated binary output in the steady state is guaranteed such that $v_y \in \{-1, +1\}^{2n}$. The maximum eigenvalue $\lambda_{max}$, on the other hand, is difficult to determine and may vary sequence by sequence for channels with slowly time-varying characteristics. The eigenvalues of $\overline{X}$ are real and upper-bounded by:

$$\lambda \leq \lambda_{max}^U = x_0 + 2 \sum_{k=1}^{L} (|x_{ik}| + |x_{qk}|). \quad (16)$$

Therefore, the parameter µ can be chosen such that $\mu \geq -\lambda_{max}^U/2$. The condition on the parameter µ can be somewhat alleviated by allowing an indefinite $\overline{M}$ with all positive elements on the main diagonal, i.e., $\overline{A}(i,j;i,j) -T_x = -x_0 - 2\mu > 0$.

Figures 3A, 3B:
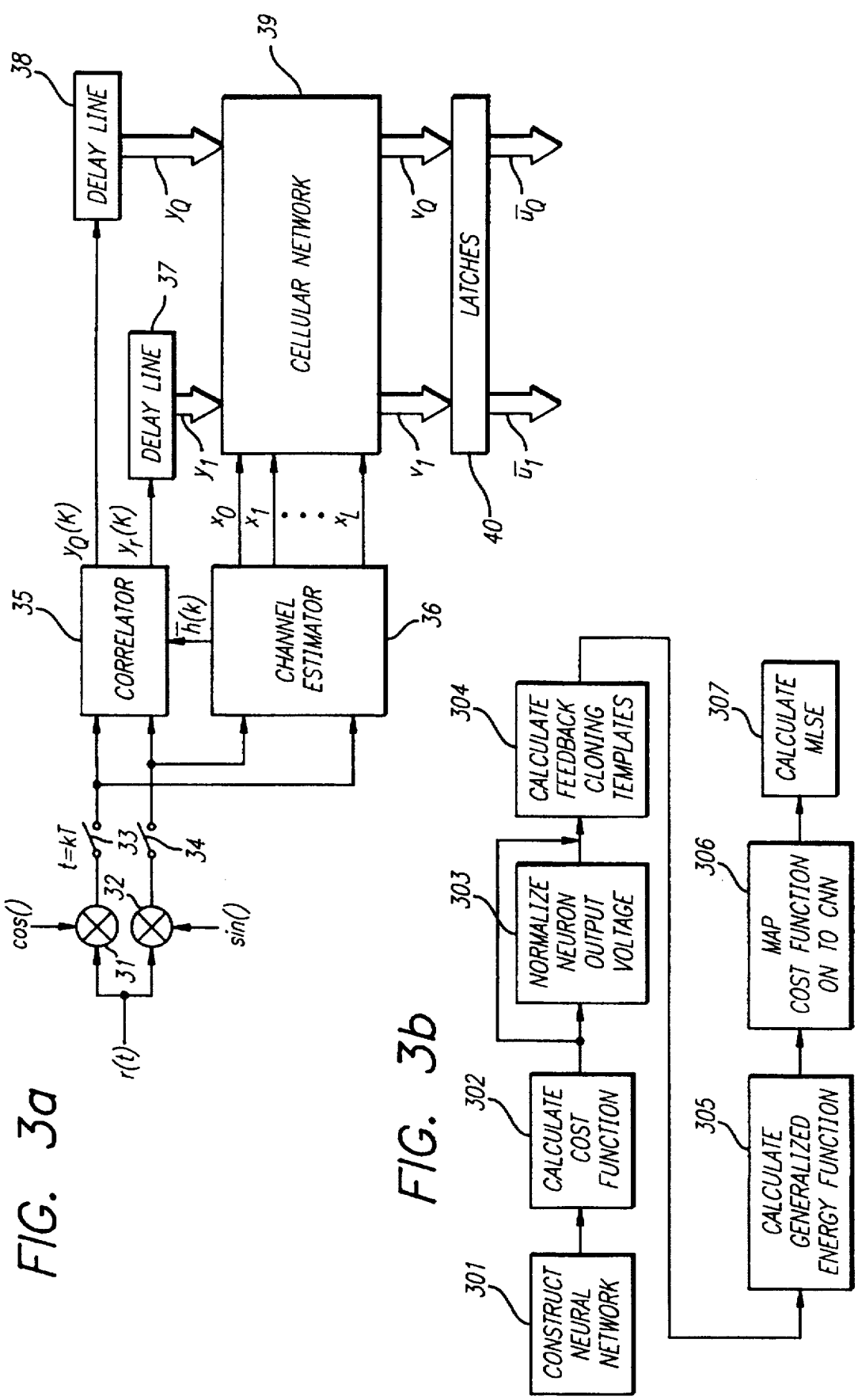
FIG. 3a is a block diagram of a compact neural network MLSE receiver in accordance with the current invention.
FIG. 3b presents a flow diagram of the solution to the problem of finding the global minimum for a given single-dimension signal optimization problem.

FIG. 3a presents a functional block diagram of the steps associated with a compact neural network used in the nonlinear signal processing for the MLSE. First, the compact neural network 39 is constructed using the transconductance matrix and the input vector in construction step 301. The system then calculates the expanded and reformatted cost function in cost function calculation step 302. Neuron output voltage normalization step 303 is an optional step which normalizes the neuron output voltage. Feedback coefficient templates are calculated using feedback coefficient template calculation step 304, and energy function calculation step 305 computes the generalized energy function. Finally, the cost function is mapped onto the compact neural network 39 constructed by the transconductance matrix and the input vector in mapping step 306. The MLSE is calculated through the evolution of the state functions within the compact neural network 39 over a period of time in calculation step 307.

Coefficient Templates and Stability

From Equation 13, the compact neural network has two rows and the feedback synaptic weight $$\overline{A} = \begin{bmatrix} A_0 | A_1^T \\ A_1 | A_0 \end{bmatrix} = \begin{bmatrix} -X_I + (T_x - 2\mu)I & -X_Q^T \\ -X_Q & -X_I + (T_x - 2\mu)I \end{bmatrix}, \quad (17)$$

where $A_0^T = A_0$ and $A_1^T = -A_1$. The corresponding coefficient templates are given as $$T_A = \quad (18)$$

$$\begin{bmatrix} -x_{iL} & \ldots & -x_{i2} & -x_{i1} & 0 & x_{i1} & x_{i2} & \ldots & x_{iL} \\ -x_{rL} & \ldots & -x_{r2} & -x_{r1} & -x_0 + T_x - 2\mu & -x_{r1} & -x_{r2} & \ldots & -x_{rL} \\ x_{iL} & \ldots & x_{i2} & x_{i1} & 0 & -x_{i1} & -x_{i2} & \ldots & -x_{iL} \end{bmatrix}$$

$T_B = [1,0]$.

For the binary case, the feedback operator in Equation 18 is reduced to $$T_A = [-x_L | \ldots | -x_2 | -x_1 | -x_0 + T_x - 2\mu | -x_1 | -x_2 | \ldots | -x_L]. \quad (19)$$

The stability of the CNN with asymmetric cloning templates of the form of Equation 18 can be directly checked by using Equation 17. By using the chain rule, the time derivative of E can be given by a scalar product of two vectors $$\frac{dE}{dt} = \frac{\partial E}{\partial v_y} \cdot \frac{dv_y}{dt} = \sum_{k=1}^{N} \frac{\partial E}{\partial v_{yk}} \cdot \frac{dv_{yk}}{dt} \quad (20)$$

where $dv_y/dt = 0$ for neuron 1 with saturated outputs. Let us consider only nonzero terms $k \neq 1$ in Equation 20. From Equation 12, we have $$\frac{\partial E}{\partial v_y} = \frac{\partial}{\partial v_y} \left( -\frac{1}{2} v_y^T M v_y - v_y^T b \right) = -\frac{1}{2} (M v_y + M^T v_y) - b. \quad (21)$$

By using the property $X_Q^T = -X_Q$ in (17), it can be readily shown that M is symmetric, $M^T = (\overline{A} - T_x I)^T = M$. Therefore, for $k \neq 1, v_{yk} = v_{xk}$, $dv_{yk}/dt = dv_{xk}/dt$, and $$\frac{\partial E}{\partial v_y} = -(Mv_y + b) = -C_x \frac{dv_x}{dt} . \tag{22}$$

Figure 4:
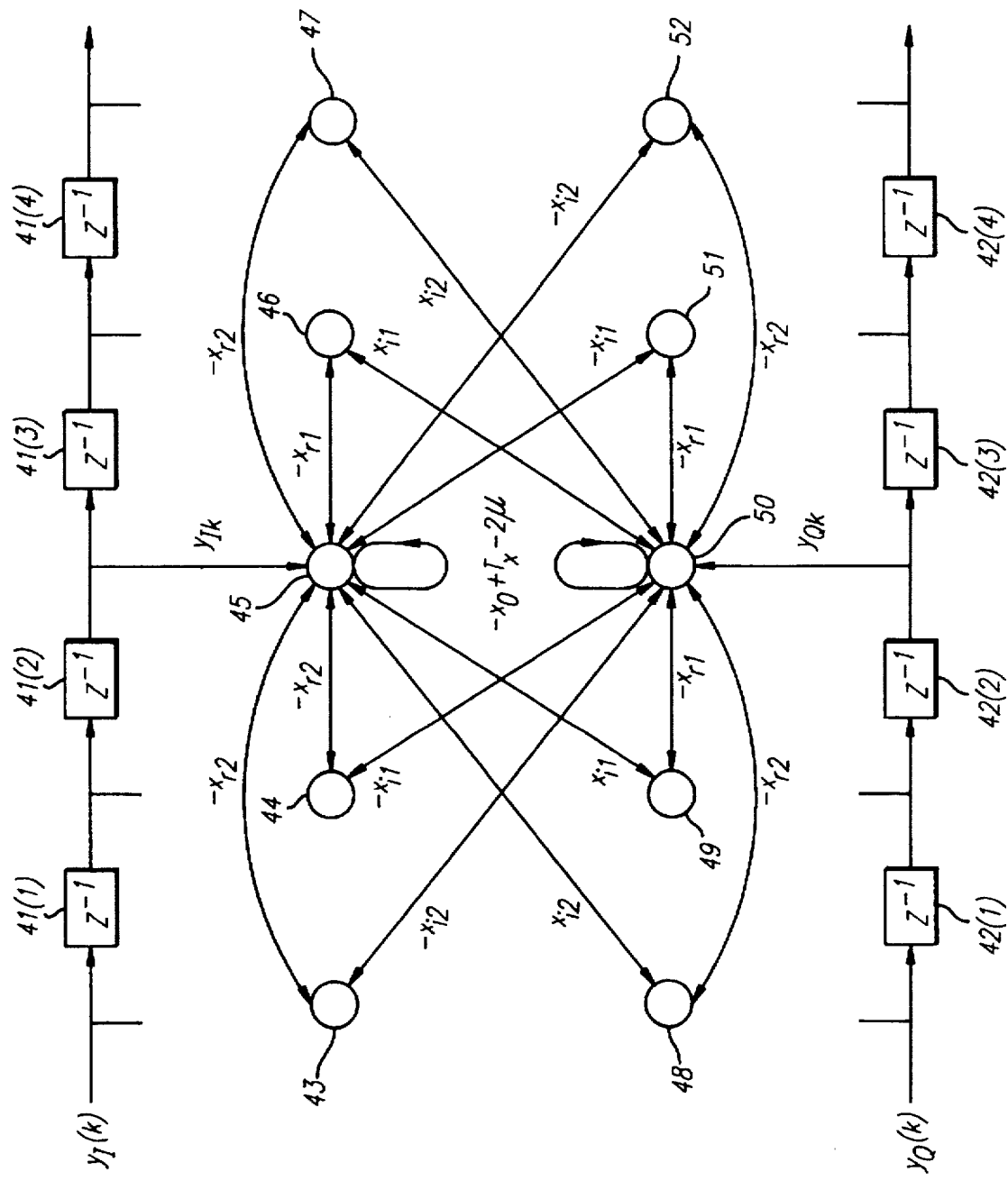
FIG. 4 illustrates a compact neural network for QPSK modulation with an interference span of two symbols.

Thus, for $C_x > 0$, $$\frac{dE}{dt} = -C_x \sum_{k \neq 1} \frac{dv_{xk}}{dt} \cdot \frac{dv_{yk}}{dt} = -C_x \sum_{k \neq 1} \left( \frac{dv_{xk}}{dt} \right)^2 \leq 0,$$

and the energy E decreases as time elapses, resulting in a stable binary output for which the energy function of Equation 12 is locally minimized. The network diagram of Equation 18 is shown in the compact neural network diagram for QPSK modulation over two intervals of FIG. 4. In-phase and quadrature-phased signals are delayed by in-phase delay elements 41(1) through 41(4) and quadrature-phased delay elements 42(1) through 42(4). At each delay level, the signal is relayed to nodes 43 through 52. In-phase data is routed directly to node 45, and quadrature-phased data is transmitted to node 50. Data then propagates as shown in FIG. 4 to nodes 43, 44, 46, 47–49, 51 and 52. Further, nodes 45 and 50 feed data back to themselves in forming the coefficient templates.

Note that the elements of $T_A$ may be updated dynamically as the characteristics of transmission medium changes. For the coefficient templates of the form described in Equation 18, the feedback operator is symmetric in a row, but has an opposite sign in adjacent two rows. However, the matrix M is symmetric and the compact neural network always finds a stable equilibrium.

Hardware Architecture

The number of neurons $N_N$ is equal to the number of bits in the sequence, e.g., $N_N = n$ in the binary case and $N_N = 2n$ in the QPSK case. The n x n matrix $\overline{A}$ has $n(2L+1) - L(L+1)$ nonzero elements which is approximately equal to $n(2L+1)$ if $n > L$ is $$N_w = \begin{cases} n(2L+1): & \text{real(binary)} \\ 2n(4L+1): & \text{complex}(QPSK). \end{cases} \tag{24}$$

Since $x_{-k} = x_k, 1 \leq k \leq L$, for stationary channels, the number of interconnections can be further reduced from $2L+1$ to $L+1$ by using balanced circuits. With fully-balanced neuron outputs $v_{yi+k}$ and $\overline{v}_{yi+k} = -v_{yi+k}$ the differential input of a synapse circuit can be given by $-v_{yi+k} - v_{yi-k}$. Thus, $N_w$ can be reduced to $n(L+1)$ for binary signal and $n(2L+1)$ for QPSK case. The MLSE neural network thus has a strong local connectivity.

$$v_{yij} = f \left( \sum_{k=1,2} \sum_{l=i-L}^{i+L} k_{kl} x_{kl} v_{ykl} + \right. \tag{25}$$

$$\left. (T_x - 2\mu) v_{yij} + y_I \right), i = 1, 2, j = 1, 2, \ldots, n,$$

where $K_{kl} = -1$ or $+1$ depending on the sign values in the coefficient templates of Equation 18. The synaptic weights are non-zero for $2L+1$ and $2L$ neighboring cells in a current and adjacent rows, respectively. This local interconnection scheme is very desirable for efficient hardware implementation using VLSI technologies.

To accommodate the channels with slowly time-varying characteristics, the synapse circuits must be programmable. The transconductance multiplier using the double-MOS linear resistor is a hardware-efficient element for this purpose. As shown in FIG. 5, the transconductance multiplier 53 requires only four transistors 54 through 57 of small or moderate device sizes and its input and control terminals are differential. All transistors 54 through 57 are matched through identical W/L aspect ratio and operate in the triode region if the condition $V_1, V_2, V_3 \leq \min[V_{c1} - V_{th}, V_{c2} - V_{th}]$ is met where $V_{th}$ is the threshold voltage of the MOS transistor. The differential output current is given by $$I_{12} = J_1 - I_2 = K_0 (V_{c1} - V_{c2})(V_1 - V_2) \tag{26}$$

where $K_0 = 2\mu C_{ox}(W/L)$. Here $\mu$ is the mobility of electronics for n-channel MOS transistors. The equivalent differential transconductance is thus given by $$T_{eq} = \frac{1}{R_{eq}} = K_0(V_{c1} - V_{c2}) \tag{27}$$

and can be varied by the differential control voltage ($V_{c1} - V_{c2}$). Since the swing voltages of inputs $v_{yi}$ and $v_{ui} = z_i$ are relatively small compared to the state voltage $v_{xi}$, the condition for triode-region operation of the double-MOS linear resistor is usually met in most compact neural network applications.

FIG. 6 shows the circuit diagram of the preferred implementation of the i-th neuron and associated synapses for binary signaling. Those of ordinary skill in the art will appreciate that in accordance with the architecture already described, various hardware implementations may be realized, and FIG. 6 represents one possible hardware implementation. Double-MOS linear resistors 62(0) through 62(L) form the coefficient templates outlined above. The differential current flowing into two virtual ground nodes of the operation amplifier is given for $i = 0, 1, \ldots, n-1$, by $$I_1 - I_2 = -K_0 \left[ (x_0 - T_x + 2\mu) v_{yi} + \sum_{k=1}^{L} x_k (v_{yi+k} + v_{yi-k}) \right] + \tag{28}$$

$$K_0 V_{cy}$$

where $V_{cy}$ is a fixed voltage. Some of $V_{yi-k}$ or $V_{yi+k}$ are zero for the edge neurons $i = 0, 1, \ldots, L-1$ and $i = n-L, \ldots, n-1$. The differential output voltage is thus $$V_1 - V_2 \equiv -R_x(I_1 - I_2) = -\frac{1}{K_0 V_{cx}} (I_1 - I_2), \tag{29}$$

where $V_{cx}$ is the control voltage of the feedback double-MOS linear resistor. This control voltage determines the overall neuron gain. The equivalent resistance $R_x = 1/(K_0 V_{cx})$ together with the capacitor $C_x$ performs a lossy integration represented by the differential equation, Equation 8. The nonlinear amplifier 69 following the summing circuit 66 has the piecewise-linear transfer function. To generate both positive output $v_{yi}$ and negative output $-v_{yi}$, a nonlinear amplifier 69 with fully-balanced outputs is required. In general, the external input $y_i$ can be fed into a compact neural network through the feedforward input $V_{ui} = y_i$, initial state voltage $v_{xi}(0) = Y_i$, or combination of these two. For feeding the external input through the feedforward input, the capacitors 65a and 65b are set to zero initial values at the beginning of each operation by closing summing circuit switches 67 and 68 as shown in FIG. 6. The writing of the initial voltage into the feedback capacitor in balanced circuits can be done by setting $v_{ui} = y_i$ and allowing enough time to fully charge the capacitor. During this initialization operation, all other weights must be zero by making $V_{c1} = V_{c2}$ in Equation 27.

The analog tapped-delay line consisting of a cascade of sample-and-hold (S&H) circuits typically causes significant errors as discrete-time samples are shifted through due to the accumulation of noise generated in S&H circuits. For continuous operations while the compact neural network 39 is performing the MLSE, the de-multiplexed delay lines must be used. As shown in FIG. 7a, n S&H circuits 70(0) through 70(n−1) in parallel can perform the pipelined operation without the accumulation of noise. Each high-impedance buffer has two separate holding capacitors at the input 71a, 71b, 72a and 72b, one of which is to accept new sample while the other in the respective S&H circuit holds the previous value as the input to the compact neural network in operation. The clock signals $\phi_1^k$ and $\phi_2^k$, k=0,1,...,n−1, are used for sampling, and $100_3$ is a control signal which is common to all S&H circuits 70(0) through 70(n−1) for multiplexing two voltages on the holding capacitors 71a, 71b, 72a, and 72b. Note that either $\phi_1^k$'s or $\phi_2^k$'s are off for a period of $T_m$ during which n shift operations occur.

Figure 7B:
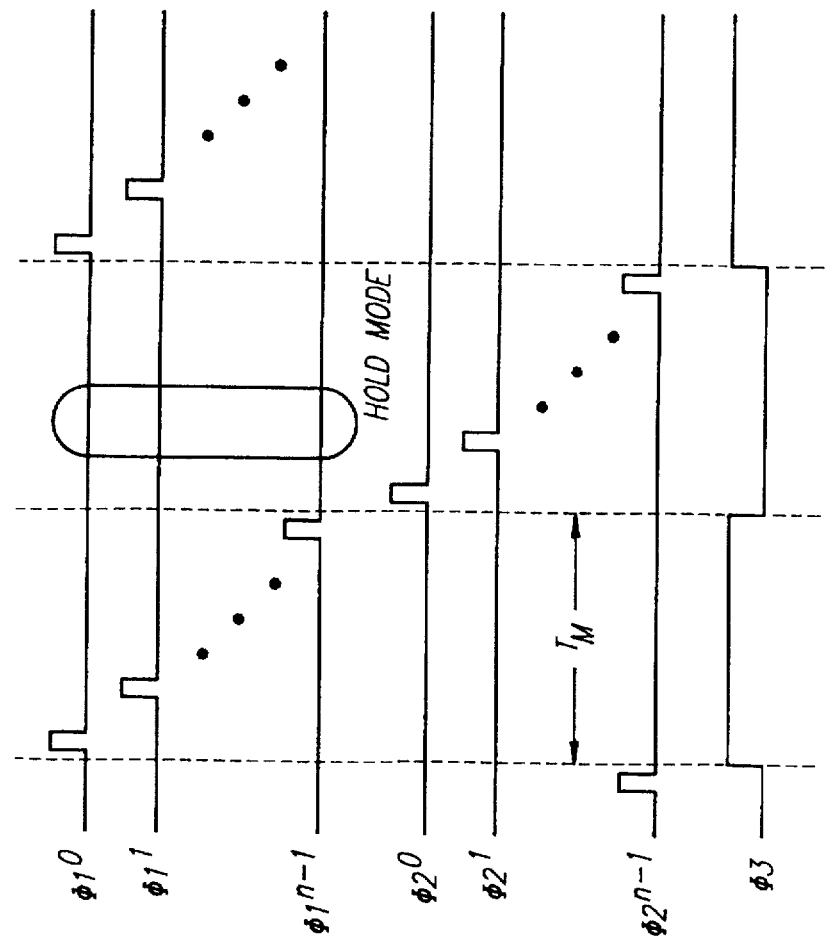
FIG. 7b presents a timing diagram for an analog tapped delay line.
Figure 7A:
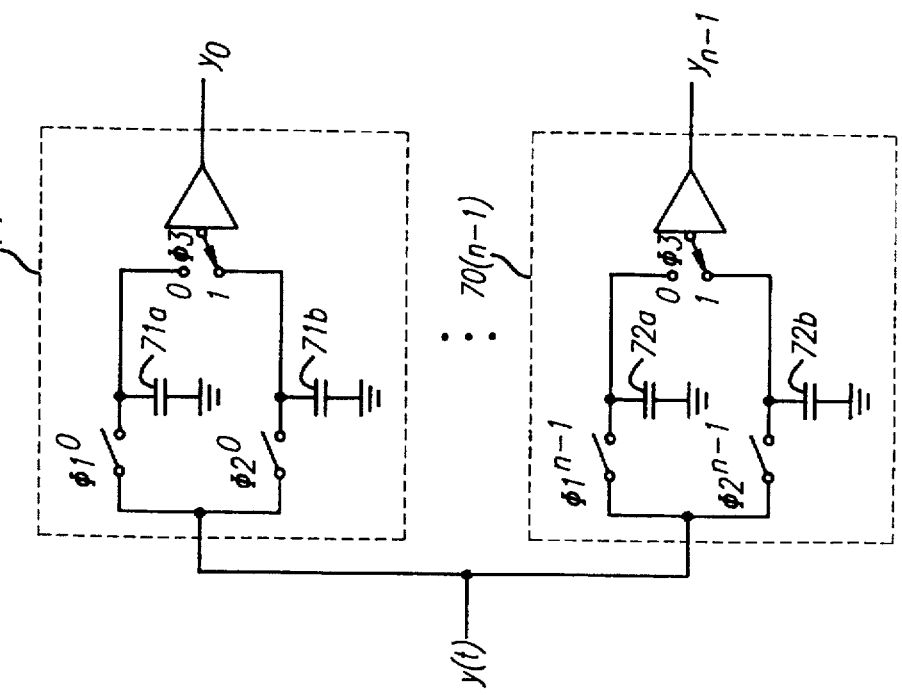
FIG. 7a is a schematic diagram of an analog tapped delay line.

FIG. 7b shows the timing diagram of these clock signals. Since the delay-line operates at a speed of symbol rate, its speed can be a limiting factor that determines the overall throughput of the MLSE operation. Several S&H circuits using, CMOS technologies have been reported for high-speed, high-precision applications.

Modular Architecture

For the detection of especially long sequence, a multiple of MLSE neuroprocessors with modular architecture can be cascaded if the effects of interconnections between networks are negligible. First consider the binary case in which all signals are real. If we define $$\hat{X} = [\hat{X}_U^T | X^{TX}_L^T] = [\hat{X}_U^T | X | \hat{X}_L^T] \quad (30)$$

where $\hat{X}_U$ and $\hat{X}_L$ are two L×n matrices as defined as $$\hat{X}_U = - \begin{bmatrix} x_L & 0 & 0 & \cdots & 0 & | & 0 & \cdots & 0 \\ x_{L-1} & x_L & 0 & \cdots & 0 & | & 0 & \cdots & 0 \\ \vdots & & & & & | & & & \vdots \\ \vdots & & & & & | & & & \vdots \\ x_1 & x_2 & x_3 & \cdots & x_L & | & 0 & \cdots & 0 \end{bmatrix}$$

and $$\hat{X}_L = - \begin{bmatrix} 0 & \cdots & 0 & | & x_L & \cdots & x_3 & x_2 & x_1 \\ \vdots & & & | & & & & & \vdots \\ \vdots & & & | & & & & & \vdots \\ 0 & \cdots & 0 & | & 0 & \cdots & 0 & x_L & x_{L-1} \\ 0 & \cdots & 0 & | & 0 & \cdots & 0 & 0 & x_L \end{bmatrix}$$

Thus, the compact neural network with the transconductance matrix $\hat{X}$ can be divided into m subnetworks such that $$\hat{X} = [\hat{X}_0 | \hat{X}_1 | \cdots | \hat{X}_{m-2} | \hat{X}_{m-1}], \quad (31)$$

where $\hat{X}_k$, k=0,1,...,m−1, is $\hat{X}_0$ shifted or permutated down by k rows. Furthermore, if $\Omega$ denote $\hat{X}_0$ with all zero rows removed, i.e., $\hat{X}_0^T = [\Omega^T|0]$, then the original network can be constructed by cascading m subnetworks, each having the transconductance matrix $\Omega$. The uppermost L and bottommost L feedback inputs associated with $\hat{X}_u$ and $\hat{X}_L$ are set to zeros, which correspond to the leading and tailing zeros of the sequence to be estimated. In this way, the original network structure is preserved, i.e., $\hat{X}_u = \hat{X}_L = 0$ and $\hat{X} = X$. In the QPSK case, the resulting network for the MLSE can be turned into a modular architecture by adding dummy rows to the transconductance matrix. In this case, $\hat{X}_u$ and $\hat{X}_L$ defined above are required for every sub-matrix of $\overline{X}$, as given in Equation 5.

Hardware Annealing

Even with a correct mapping of the MLSE function onto a neural network, the desired optimal or near-optimal solutions are not guaranteed because a combinatorial optimization problem always involves a large number of local minima. Therefore, in addition to the basic structure of the network, the annealing capability is provided to obtain the global minimum of the cost function of Equation 3 over all possible combinations of sequence. Hardware annealing is a dynamic relaxation process for finding the optimum solutions in the recurrent associative neural networks such as Hopfield networks and locally-connected neural networks. Near optimal solutions can be obtained by applying the hardware annealing technique for avoiding local minima problems which are inherent in combinational optimizations.

Figure 8B:
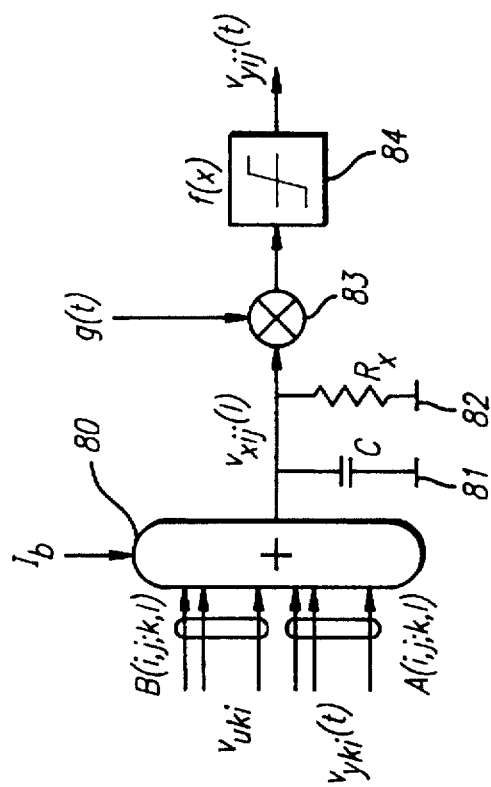
FIG. 8b presents a block diagram of a variable-gain piecewise-linear neuron-cell with a two-quadrant analog multiplier.
Figure 8A:
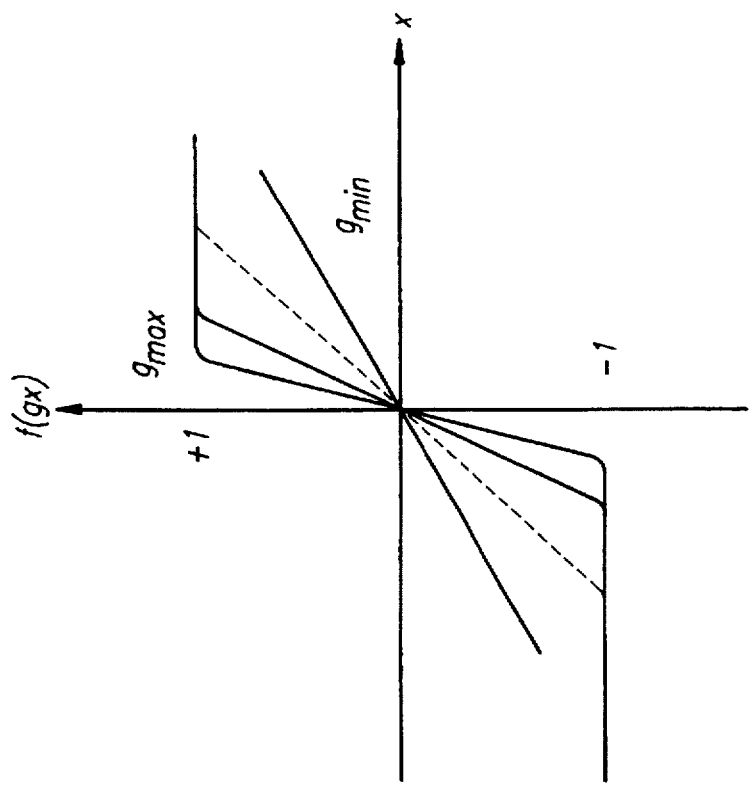
FIG. 8a is a series of transfer function curves for various gain values in a variable-gain piecewise-linear neuron cell.

Hardware annealing is performed by controlling the gain of the neuron, which may be assumed to be the same for all neurons throughout the network. After the state is initialized $V_x = v_x(0)$, the initial gain at time t=0 may be set to an arbitrarily small, positive value such that $0 \leq g(0) < 1$. It then increases continuously for $0 < t \leq T_A$ to the nominal gain of 1. The maximum gain $g_{max}=1$ is maintained $T_A < t \leq T_c$, during which the network is stabilized. When the hardware annealing is applied to a compact neural network by increasing the neuron gain g(t), the transfer function can be described by $$v_{xij}(t) = f(g(t)v_{xij}(t)) = \begin{cases} +1; & g(t)v_{xij}(t) \geq 1 \\ g(t)v_{xij}(t); & -1 < g(t)v_{xij}(t) < 1 \\ -1; & g(t)v_{xij}(t) \leq -1 \end{cases} \quad (32)$$

or simply y=f(gx). The saturation level is still y=+1 or −1 and only the slope of f(x) around x=0 varies. By using the normalized variables in vector and matrix notations, Equation 12 can be rewritten as $$E = -\frac{1}{2} v_y^T A v_y + \frac{T_x}{g} v_y^T v_y - v_y^T b \quad (33)$$

$$= -\frac{1}{2} v_y^T M_g v_y - v_y^T b$$

where $v_y = f(gv_x)$ and $M_g = A - (T_x/g)I$. The process of finding the optimal solutions takes place during the change of $M_g$ from a negative definite matrix to indefinite or positive matrix, as the annealing gain g increases. FIGS. 8a and 8b show the diagrams of a possible realization of the variable-gain piecewise-linear function of Equation 32 using a two-quadrant analog multiplier. FIG. 8a is a series of transfer function curves for various gain values in a variable-gain piecewise-linear neuron cell. In FIG. 8b, summation element 90 receives the A and B matrix and feedback and feedforward values from neighboring elements. Gain is multiplied at multiplication element 83, and the signal is passed through nonlinear element 84. Although the variable-gain can be readily achieved by controlling the voltage of capacitor 81 $V_{cx}$ in FIG. 6, it also changes the value of the resistor 82 $R_x$ which must be kept constant as closely as possible for proper annealing operation. Thus, each neuron requires a separate gain control circuit.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A compact neural network detector for providing an optimal solution for a received one-dimensional signal, comprising:
- a signal dividing circuit which separates the received one-dimensional signal into an in-phase signal and a quadrature-phased signal;
- a plurality of samplers, wherein said samplers sample said in-phase signal and said quadrature-phased signal at a predetermined rate, thereby producing an in-phase discrete time signal and a quadrature-phased discrete time signal;
- a channel estimation filter, wherein said channel estimation filter receives output from said plurality of samplers and transmits a plurality of L channel estimates and is matched to a channel impulse response;
- a correlation filter, wherein said correlation filter correlates said discrete time signals with the channel impulse response and transmits an in-phase output and a quadrature-phase output;
- an in-phase delay line for delaying said in-phase output;
- a quadrature-phase delay line for delaying said quadrature-phase output;
- a compact neural network having shift-invariant piecewise-linear function neurons receiving the in-phase delayed output, the quadrature-phase delayed output, and the channel estimates; and
- a plurality of latches.

2. The compact neural network detector of claim 1, wherein said compact neural network comprises a plurality of identical analog cells arranged in an array of cells, wherein the cells in the array are interconnected with all neighboring cells.

3. The compact neural network detector of claim 2, wherein each cell includes:
- feed forward connections coupled to each cell for affecting the state of each of said neighboring cells;
- feedback connections coupled to each cell for affecting the state of each of said neighboring cells; and
- feedback connections for affecting the state of the cell.

4. The compact neural network detector of claim 3, wherein said cells comprise programmable synapse circuits.

5. The compact neural network detector of claim 2, wherein said compact neural network further comprises:
- means for providing independent control over all cells in the compact neural network; and
- a nonlinear gain circuit in each cell.

6. The compact neural network detector of claim 5, wherein said nonlinear gain circuit comprises:
- means for setting a neuron gain to a relatively small positive value;
- means for increasing the neuron gain continuously during an initial time period to a maximum value; and
- means for maintaining the neuron gain at the maximum value for a subsequent time period.

7. The compact neural network detector of claim 5, wherein said nonlinear gain circuit provides a transfer function of negative unity for neuron gain multiplied by state voltage values within a first region, a predetermined gain for neuron gain multiplied by state voltage values within a second region, and unity for neuron gain multiplied by state voltage values within a third region.

8. The compact neural network detector of claim 7, wherein said predetermined gain equals neuron gain multiplied by state voltage.

9. The compact neural network detector of claim 7 wherein said two-quadrant analog multiplier has a transfer function of negative unity for neuron gain multiplied by state voltage values less than one, a predetermined gain for neuron gain multiplied by state voltage values greater than negative unity and less than unity, and unity for neuron gain multiplied by state voltage values greater than unity.

10. The compact neural network detector of claim 9, wherein said predetermined gain equals neuron gain multiplied by state voltage.

11. The compact neural network detector of claim 10 wherein each cell comprises a separate gain control circuit to simultaneously control capacitor voltage while minimizing resistance variance within the resistor circuit.

12. The compact neural network detector of claim 1, wherein said delay lines operate at an integer multiple of symbol rate.

13. The compact neural network detector of claim 1, wherein said delay lines comprise a high impedance buffer having a plurality of holding capacitors at an input to the buffer.

14. The compact neural network detector of claim 6, wherein at least one of said holding capacitors accepts new samples and at least one of all remaining holding capacitors holds the previous value for input to said neural network.

15. The compact neural network detector of claim 1, wherein said compact neural network comprises:
- a layout circuit for mapping an MLSE cost function onto the neural network, said layout circuit constructed by a cost function, an energy function, a system transconductance matrix and information received from said delay lines.

16. The compact neural network detector of claim 8, wherein said energy function is calculated using coefficient templates and information received from said delay lines.

17. The compact neural network detector of claim 9, wherein said cloning templates are normalized.

18. The compact neural network detector of claim 8, wherein when said energy function is a convex function of information to be detected, a constraint energy is added to said energy function forming a modified energy function, and said modified energy function is mapped onto said compact neural network.

19. The compact neural network detector of claim 1, wherein said compact neural network comprises:
- a plurality of cells, each of said cells comprising:
  - a summation element;
  - a capacitor circuit connecting output from said summation element to ground;
  - a resistor circuit connecting output from said summation element to ground;
  - a gain multiplier element; and
  - a two-quadrant analog multiplier.

20. A compact neural network maximum-likelihood sequence estimation detector for providing an optimal solution for a received one-dimensional signal, comprising:
- a signal dividing circuit;
- a plurality of samplers, wherein said samplers transmit a plurality of discrete time signals based on output received from said signal dividing circuit;
- a channel estimation filter which receives output from said plurality of samplers;
- a correlation filter which correlates said discrete time signals with a channel impulse response;
- a plurality of delay lines for delaying output received from said correlation filter; and a compact neural network having shift-invariant piecewise-linear function neurons which receives data from said delay lines and said channel estimator.

21. The compact neural network detector of claim 20, wherein said compact neural network comprises a plurality of identical analog cells arranged in an array of cells, wherein the cells closest to any individual cell in the array are interconnected with all neighboring cells.

22. The compact neural network detector of claim 21, wherein each cell includes:
   feed forward connections coupled to each cell for affecting the state of each of said neighboring cells;
   feedback connections coupled to each cell for affecting the state of each of said neighboring cells; and
   feedback connections for affecting the state of the cell.

23. The compact neural network detector of claim 22, wherein said cells comprise programmable synapse circuits.

24. The compact neural network detector of claim 20, wherein said delay lines operate at symbol rate.

25. The compact neural network detector of claim 20, wherein said delay lines comprise a high impedance buffer having a plurality of holding capacitors at an input to the buffer.

26. The compact neural network detector of claim 25, wherein at least one of said holding capacitors accepts new samples and at least one of all remaining holding capacitors holds the previous value for input to said neural network.

27. The compact neural network detector of claim 20, wherein said compact neural network comprises:
   a layout circuit for mapping an MLSE cost function onto the neural network, said layout circuit constructed using a cost function, an energy function, a system transconductance matrix and information received from said delay lines.

28. The compact neural network detector of claim 27, wherein said energy function is calculated using predetermined cloning templates and information received from said delay lines.

29. The compact neural network detector of claim 28, wherein said cloning templates are normalized.

30. The compact neural network detector of claim 27, wherein when said energy function is a convex function of information received from said delay lines, a constraint energy is added to said energy function forming a modified energy function, and said modified energy function is mapped onto said neural network.

31. The compact neural network detector of claim 20, wherein said compact neural network comprises:
   means for providing independent control over all cells in the compact neural network;
   means for setting a neuron gain for all cells in the compact neural network to a relatively small positive value;
   means for increasing the neuron gain continuously during an initial time period to a value of unity; and
   means for maintaining the neuron gain at unity for a subsequent time period.

32. The compact neural network detector of claim 31, wherein said providing means, setting means, increasing means, and maintaining means provide a transfer function of negative unity for gain values less than one, the neuron gain multiplied by the state voltage for gain values greater than negative unity and less than unity, and unity for gain values greater than unity.

33. The compact neural network detector of claim 20, wherein said compact neural network comprises:
   a plurality of cells, each of said cells comprising:
   a summation element;
   an integrator circuit consisting of a capacitor and a resistor;
   a gain multiplier element; and
   a two-quadrant analog multiplier.

34. The system of claim 33 wherein said two-quadrant analog multiplier has a transfer function of negative unity for gain values less than one, the neuron gain multiplied by the state voltage for gain values greater than negative unity and less than unity, and unity for gain values greater than unity.

35. The system of claim 34 wherein each cell comprises a separate gain control circuit to simultaneously control capacitor voltage while minimizing resistance variance within the resistor circuit.

36. A compact neural network detector for providing an optimal solution for a received one-dimensional signal, comprising:
   a channel estimator, wherein said channel estimator produces a plurality of channel estimates based on said one-dimensional signal;
   a correlation filter;
   at least one delay line for delaying signals received from said correlation filter; and
   a compact neural network having shift-invariant piecewise-linear function neurons receiving the delayed signals and channel estimates.

37. The compact neural network detector of claim 36, further comprising:
   a signal dividing circuit which separates the received one-dimensional signal into an in-phase signal and a quadrature-phased signal; and
   a plurality of samplers, wherein said samplers sample said in-phase signal and said quadrature-phased signal at a predetermined rate, thereby producing an in-phase discrete time signal and a quadrature-phased discrete time signal.

38. The compact neural network detector of claim 36, wherein said channel estimator transmits a plurality of channel estimates and is matched to a channel impulse response.

39. The compact neural network detector of claim 36, wherein said delay lines comprise an in-phase delay line and a quadrature-phased delay line.

40. The compact neural network detector of claim 36, wherein said compact neural network comprises a plurality of identical analog cells arranged in an array of cells, wherein the cells in the array are interconnected with all neighboring cells.

41. The compact neural network detector of claim 40, wherein each cell includes:
   feed forward connections coupled to each cell for affecting the state of each of said neighboring cells;
   feedback connections coupled to each cell for affecting the state of each of said neighboring cells; and
   feedback connections for affecting the state of the cell.

42. The compact neural network detector of claim 41, wherein said cells comprise programmable synapse circuits.

43. The compact neural network detector of claim 42, wherein said delay lines operate at symbol rate.

44. The compact neural network detector of claim 43, wherein said delay lines comprise a high impedance buffer having a plurality of holding capacitors at an input to the buffer.

45. The compact neural network detector of claim 44, wherein at least one of said holding capacitors accepts new samples and at least one of all remaining holding capacitors holds the previous value for input to said compact neural network.

46. The compact neural network detector of claim 36, wherein said compact neural network comprises:
   a layout circuit for mapping an MLSE cost function onto the neural network, said layout circuit constructed by a cost function, an energy function, a system transconductance matrix and information received from said delay lines.

47. The compact neural network detector of claim 46, wherein said energy function is calculated using predetermined cloning templates and information received from said delay lines.

48. The compact neural network detector of claim 47, wherein said cloning templates are normalized.

49. The compact neural network detector of claim 48, wherein when said energy function is a convex function of information received from said delay lines, a constraint energy is added to said energy function forming a modified energy function, and said modified energy function is mapped onto said compact neural network.

50. The compact neural network detector of claim 36, wherein said compact neural network further comprises:
   means for providing independent control over all cells in the compact neural network; and
   a nonlinear gain circuit in each cell.

51. The compact neural network detector of claim 50, wherein said nonlinear gain element comprises:
   means for setting a neuron gain to a relatively small positive value;
   means for increasing the neuron gain continuously during an initial time period to a value of unity; and
   means for maintaining the neuron gain at unity for a subsequent time period.

52. The compact neural network detector of claim 51, wherein said nonlinear element process provides a transfer function of negative unity for neuron gain multiplied by state voltage values less than one, a predetermined gain for neuron gain multiplied by state voltage values greater than negative unity and less than unity, and unity for neuron gain multiplied by state voltage values greater than unity.

53. The compact neural network detector of claim 62, wherein said predetermined gain equals neuron gain multiplied by state voltage.

54. The compact neural network detector of claim 36, wherein said compact neural network comprises:
   a plurality of cells, each of said cells comprising:
      a summation element;
      a capacitor circuit connecting output from said summation element to ground;
      a resistor circuit connecting output from said summation element to ground;
      a gain multiplier element; and
      a two-quadrant analog multiplier.

55. The compact neural network detector of claim 54, wherein said two-quadrant analog multiplier has a transfer function of negative unity for neuron gain multiplied by state voltage values less than one, a predetermined gain for neuron gain multiplied by state voltage values greater than negative unity and less than unity, and unity for neuron gain multiplied by state voltage values greater than unity.

56. The compact neural network detector of claim 55, wherein said predetermined gain equals neuron gain multiplied by state voltage.

57. The compact neural network detector of claim 51 wherein each cell comprises a separate gain control circuit to simultaneously control capacitor voltage while minimizing resistance variance within the resistor circuit.

* * * * *